(12) United States Patent
Wei (10) Patent No.: US 12,112,811 B2
(45) Date of Patent: *Oct. 8, 2024

(54) POWER LEAKAGE BLOCKING IN LOW-DROPOUT REGULATOR

(71) Applicant: YANGTZE MEMORY TECHNOLOGIES CO., LTD., Wuhan (CN)

(72) Inventor: Ruxin Wei, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/242,397

(22) Filed: Sep. 5, 2023

(65) Prior Publication Data

US 2023/0410918 A1    Dec. 21, 2023

Related U.S. Application Data

(63) Continuation of application No. 17/354,993, filed on Jun. 22, 2021, now Pat. No. 11,790,996, which is a
(Continued)

(51) Int. Cl.
*G11C 5/14* (2006.01)
*G05F 1/46* (2006.01)
(Continued)

(52) U.S. Cl.
CPC .............. *G11C 16/30* (2013.01); *G05F 1/461* (2013.01); *G05F 1/575* (2013.01); *H10B 41/41* (2023.02); *H10B 43/40* (2023.02)

(58) Field of Classification Search
CPC ..... G11C 16/30; G11C 5/147; G11C 16/0483; G05F 1/461; G05F 1/575; G05F 1/561; H10B 41/41; H10B 43/40
(Continued)

(56) References Cited

U.S. PATENT DOCUMENTS

| 7,504,876 | B1 | 3/2009 | Raghavan et al. |
| 7,719,242 | B2 * | 5/2010 | Negoro ..................... G05F 1/46 |
| | | | 323/276 |

(Continued)

FOREIGN PATENT DOCUMENTS

| CN | 101615048 A | 12/2009 |
| CN | 101739054 A | 6/2010 |

(Continued)

OTHER PUBLICATIONS

International Search Report issued in corresponding International Application No. PCT/CN2021/098522, mailed Mar. 4, 2022, 4 pages.

*Primary Examiner* — Tha-O H Bui
(74) *Attorney, Agent, or Firm* — BAYES PLLC (57) ABSTRACT

In certain aspects, a circuit includes an amplifier, a first transistor, a second transistor, a third transistor, a signal pair generation circuit, and a leakage track bias generator circuit connected to the signal pair generation circuit. A gate terminal of the first transistor is connected to an output of the amplifier, and a first terminal of the first transistor is connected to an input of the amplifier. A first terminal of the second transistor is connected to a second terminal of the first transistor. A first terminal of the third transistor is connected to the first terminal of the first transistor, and a second terminal of the third transistor is connected to a second terminal of the second transistor. The signal pair generation circuit is connected to a gate terminal of the second transistor and a gate terminal of the third transistor. The leakage track bias generator circuit includes a resistor, and a first terminal of the resistor is connected to the ground.

20 Claims, 9 Drawing Sheets

Related U.S. Application Data continuation of application No. PCT/CN2021/098522, filed on Jun. 7, 2021.

(51) Int. Cl.
*G05F 1/575* (2006.01)
*G11C 16/30* (2006.01)
*H10B 41/41* (2023.01)
*H10B 43/40* (2023.01)

(58) Field of Classification Search
USPC .......................................... 365/226
See application file for complete search history.

(56) References Cited

U.S. PATENT DOCUMENTS

| | | | | |
|---|---|---|---|---|
| 8,207,719 | B2* | 6/2012 | Shiota | G05F 1/59 323/273 |
| 8,547,080 | B2* | 10/2013 | Sudo | H02J 7/0034 323/311 |
| 2007/0018711 | A1 | 1/2007 | Miki et al. | |
| 2009/0322297 | A1 | 12/2009 | Shiota | |
| 2011/0169465 | A1 | 7/2011 | Sudou et al. | |

FOREIGN PATENT DOCUMENTS

| | | |
|---|---|---|
| CN | 104881072 A | 9/2015 |
| CN | 110176871 A | 8/2019 |
| CN | 111108459 A | 5/2020 |
| CN | 111261202 A | 6/2020 |
| CN | 111833923 A | 10/2020 |
| CN | 112202441 A | 1/2021 |
| JP | 2001100851 A | 4/2001 |
| JP | 2001306163 A | 11/2001 |
| KR | 20150096197 A | 8/2015 |
| KR | 20200070603 A | 6/2020 |

\* cited by examiner

POWER LEAKAGE BLOCKING IN LOW-DROPOUT REGULATOR

CROSS-REFERENCE TO RELATED APPLICATIONS

This application is a continuation of U.S. application Ser. No. 17/354,993, filed on Jun. 22, 2021, entitled "POWER LEAKAGE BLOCKING IN LOW-DROPOUT REGULATOR," issued as U.S. Pat. No. 11,790,996, which is a continuation of International Application No. PCT/CN2021/098522, filed on Jun. 7, 2021, entitled "POWER LEAKAGE BLOCKING IN LOW-DROPOUT REGULATOR," both of which are hereby incorporated by reference in their entireties.

BACKGROUND

The present disclosure relates to low-dropout regulators.

Low-dropout regulators are a widely used component in contemporary electronic devices. Uses for low-dropout regulators range from communication devices (including wired and wireless communication devices) to portable electronics, as well as industrial, avionic, nautical, and automotive applications.

Low-dropout regulators can broadly encompass a class of direct current (DC) linear voltage regulators that may be capable of regulating an output voltage, even despite the supply voltage being close to the output voltage. As no switching takes place with such voltage regulators, they may be useful in cases where switching noise is undesired.

SUMMARY

In one aspect, a circuit can include a voltage generation circuit that includes an amplifier connected at a negative input to a reference voltage and providing an output to a gate of a first transistor. A drain voltage of the first transistor can be fed back to a positive input of the amplifier. The voltage generation circuit can receive a first voltage at the source of the first transistor. The voltage generation circuit can supply a second voltage at the drain of the first transistor. The circuit can further include a pair of transistors. The pair of transistors can include a second transistor and a third transistor. Respective bulks of the pair of transistors can be connected to a bulk of the first transistor. The gates of the pair of transistors can be controlled according to a comparison between the first voltage and the second voltage, such that only one of the pair of transistors is on at a time.

In another aspect, a circuit can include a low-dropout regulator having a first transistor. The low-dropout regulator can be configured to generate a second voltage based on a first voltage. The circuit can also include a pair of transistors, including a second transistor and a third transistor, with respective bulks of the pair of transistors connected to a bulk of the first transistor. The gates of the pair of transistors can be controlled according to a comparison between the first voltage and the second voltage, such that only one of the pair of transistors is on at a time.

In a further aspect, a method for power leakage blocking can include providing a reference voltage to a negative input of an amplifier. The method can also include providing an output of the amplifier to a gate of a first transistor. The method can further include feeding back a drain voltage of the first transistor a positive input of the amplifier. The method can additionally include receiving a first voltage at the source of the first transistor. The method can also include supplying a second voltage at the drain of the first transistor. The method can further include blocking leakage current across the transistor using a pair of transistors that include a second transistor and a third transistor, with respective bulks of the pair of transistors connected to a bulk of the first transistor. The method can additionally include controlling the gates of the pair of transistors according to a comparison between the first voltage and the second voltage, such that only one of the pair of transistors is on at a time.

In additional aspect, a memory device can include a NAND memory array for storing data. The memory device can also include a peripheral circuit coupled to the NAND memory array and including a voltage generation circuit. The voltage generation circuit can include a low-dropout regulator having a first transistor. The low-dropout regulator can be configured to generate a second voltage based on a first voltage. The low-dropout regulator can also include a pair of transistors, including a second transistor and a third transistor, with respective bulks of the pair of transistors connected to a bulk of the first transistor. Gates of the pair of transistors can be controlled according to a comparison between the first voltage and the second voltage, such that only one of the pair of transistors is on at a time.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

In a memory device, for example, a NAND Flash memory or three-dimensional (3D) Flash memory, output stage logic power voltage (vccq), can be generated from an external integrated circuit power supply voltage (vcc) via an external vcc pin, for example, in ultra-low pin count (ULPC). A low drop-out (LDO) regulator circuit can be used to generate vccq from vcc. Although a 3D NAND Flash memory is one possible implementation in which an LDO can be used, an LDO can be used in many other applications both in other kinds of memory devices and in numerous other technological fields.

Figure 1:
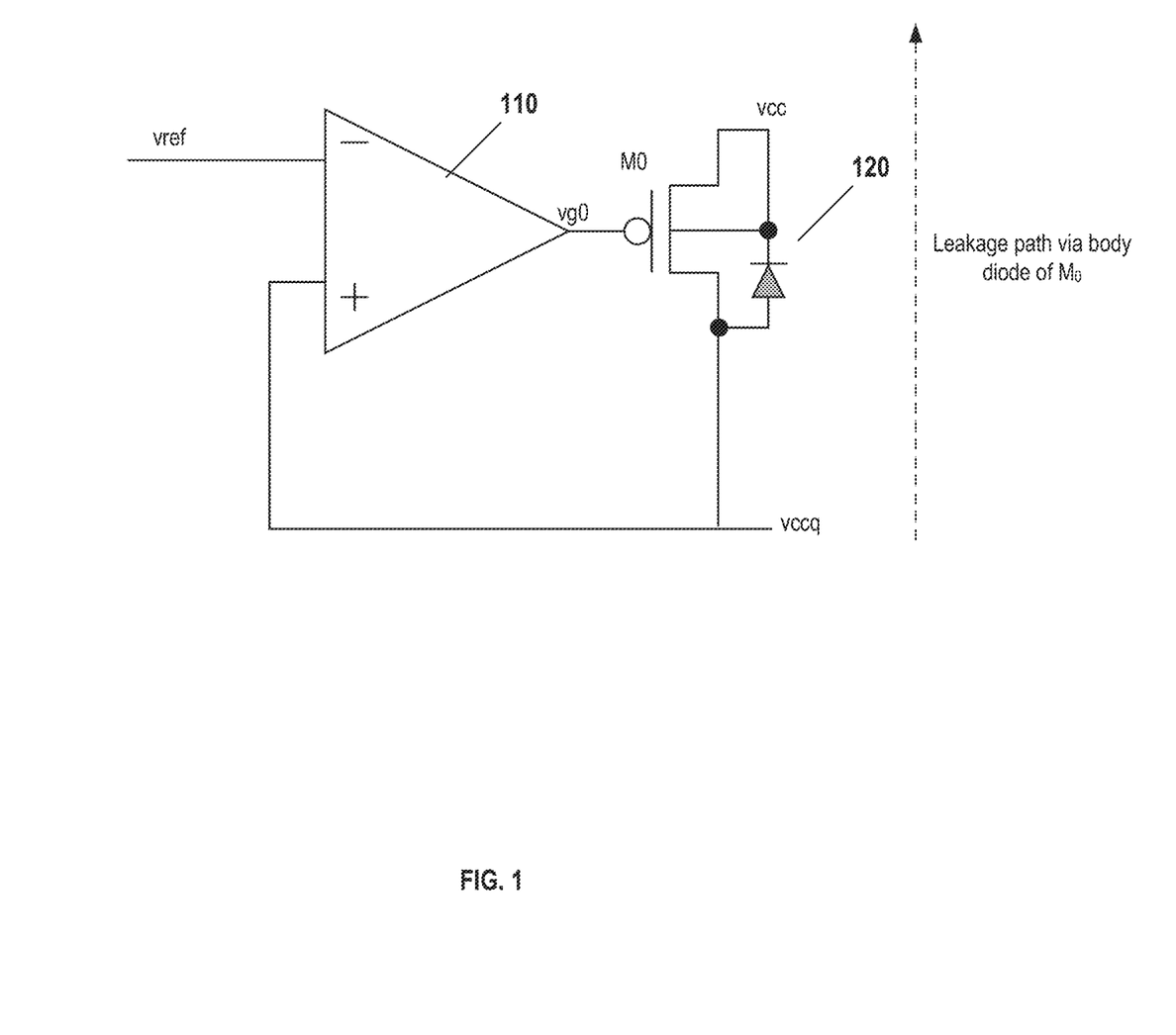
FIG. 1 illustrates a circuit diagram of a circuit for generating an output stage logic power voltage using an external integrated circuit power supply.

FIG. 1 illustrates a circuit diagram of a circuit for generating a vccq using vcc. As shown in FIG. 1, an amplifier 110 of an LDO power stage can control the gate of a PMOS transistor M0. The gate and source of PMOS transistor M0 can be tied to vcc, and the drain can be tied to the positive input of the amplifier. The negative input of the amplifier can be a reference voltage (vref). The amplifier shown in FIG. 1 can be viewed as an error amplifier or as a form of a comparator. An amplifier, such as an error amplifier, may be an element of a voltage regulator, such as an element of an LDO. Such an amplifier may also be referred to as an operational amplifier (Op-Amp).

In the circuit shown in FIG. 1, when vccq is higher than vcc, there can be a leakage path between vcc and vccq, which is illustrated by greyed-out diode 120, which is not an actual circuit element, just an equivalent structure to illustrate the leakage path.

Figure 2:
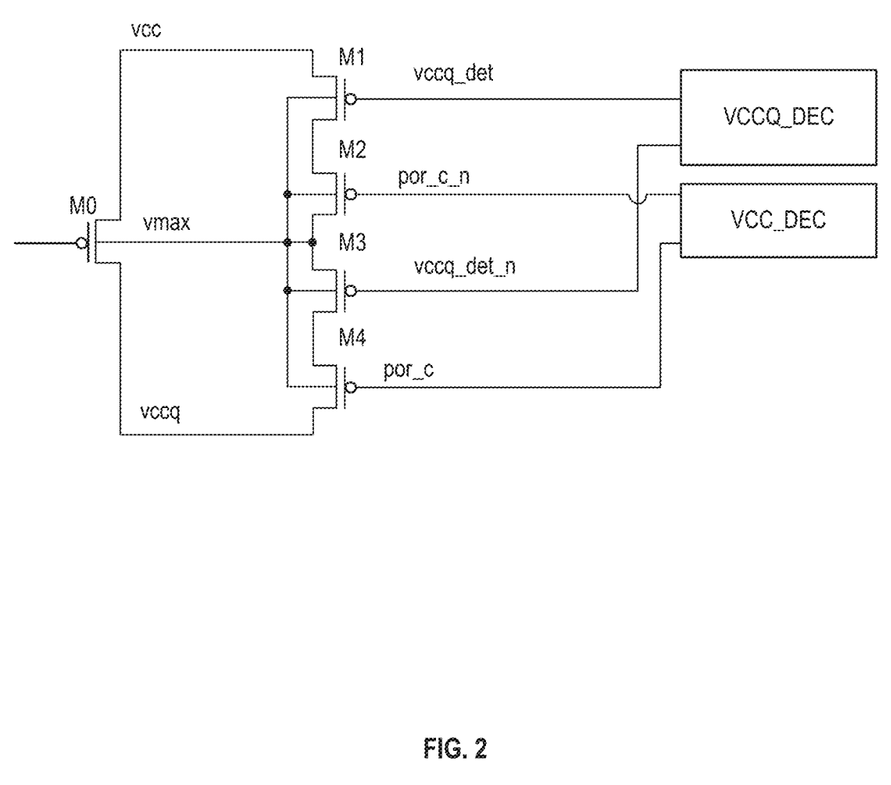
FIG. 2 illustrates a circuit diagram of a detector-based power leakage blocking circuit.

FIG. 2 illustrates a circuit diagram of detector-based power leakage blocking circuit. As shown in FIG. 2, four PMOS transistors, M1, M2, M3, and M4, and two detectors, VCCQ_DEC and VCC_DEC, can be arranged to aid in blocking leakage from vccq to vcc, namely leakage across transistor M0 to the bulk of M0 due to a difference between vmax and one or both of vcc and vccq. The expected operation of this circuit is shown in the following truth table in Table 1:

TABLE 1

| vccq | vcc | | M1 | M2 | M3 | M4 |
|---|---|---|---|---|---|---|
| 0 | 1 | por_c = 0 | on | off | on | on |
|  |  | por_c = 1 |  | on |  | off |
| 1 | 0 | vccq_det = 0 | on | on | off | on |
|  |  | vccq_det = 1 | off |  |  | on |

TABLE 1-continued

| vccq | vcc | | M1 | M2 | M3 | M4 |
|---|---|---|---|---|---|---|
| 1 | 1 | vcc > vccq | on | on | on | off |
|  |  | vcc < vccq | off |  |  | on |

As derivable from the truth table, when vccq is low (for example, ground) and por_c=0, then M2 is off; otherwise, when por_c=1, then M4 is off. Similarly, when vccq is high (shown as a logical 1, which may correspond to an on voltage for vccq) and vcc is low, then vccq_det=0 then M3 is off, otherwise when vccq_det=1, then M1 is off. Likewise, when vccq is high, and vcc is high (shown as a logical 1, which may correspond to an on voltage for vcc, which is not the same as the high voltage for vccq), then when vcc>vccq, M4 is off and when vcc<vccq, M1 is off. Complementary signals vcc_det_n and por_c_n may be the complement of vccq_det and por_c, respectively, such that if vcc_det is high, vcc_det_n is low, and vice versa, and when por_c is high, por_c_n is low, and vice versa.

In theory, therefore, it appears that always at least one of M1 through M4 is off in each condition, and consequently, a leakage path from vccq to vcc may always be blocked. In reality, however, the detection level of the detectors may just be a fixed level that cannot track process corners and temperature variations. Consequently, there may be cases where there is an uncertain voltage condition. For example, the threshold voltages for the detectors may respectively be 1.2 V for the VCC_DEC and 0.85 V for the VCCQ_DEC. When vcc is 1.1 V and vcc is 0.5 V, the gate bias voltage of M2 and M4 may be unknown, as the vccq detector may not work correctly with ultra-low voltage. Moreover, in a circuit such as FIG. 2, when the LDO is disabled, the gate voltage at M0 should be pulled up to the level of the higher of vcc and vccq, thereby seemingly avoiding leakage current through M0.

Nevertheless, in such a circuit, near the threshold voltages, there may be a large leakage current, for example, around 300 micro-amps (uA) from vcc to vccq.

Certain implementations of the present disclosure provide a general solution for power leakage blocking in on-die LDOs. These implementations may provide a simplified bulk switch structure, which can handle process corner and temperature variation, and which may be independent from a vcc detector and/or vccq detector.

Figure 3:
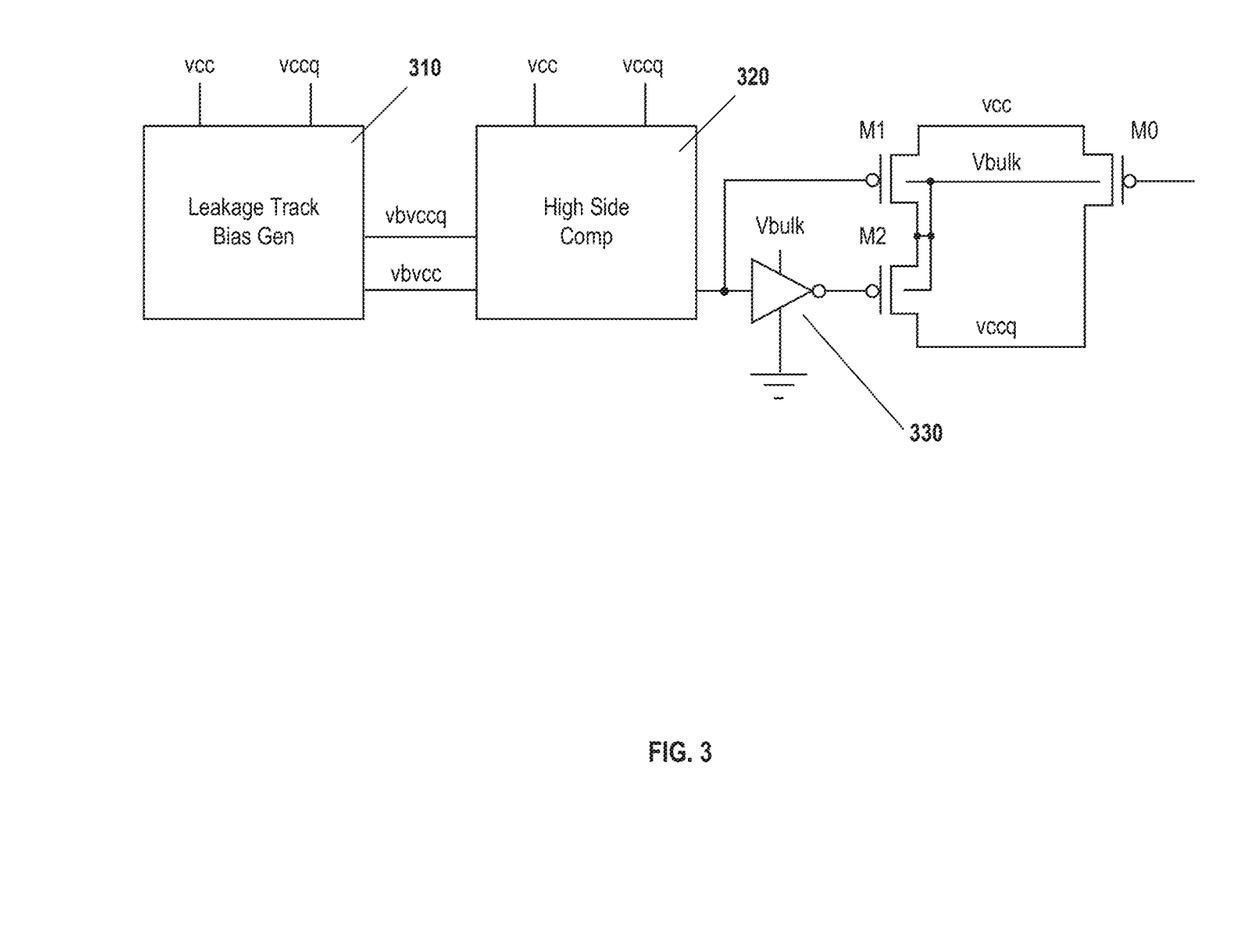
FIG. 3 illustrates a circuit diagram of an exemplary power leakage blocking circuit, according to some aspects of the present disclosure.

FIG. 3 illustrates a circuit diagram of an exemplary power leakage blocking circuit, according to some aspects of the present disclosure. In this implementation, there may be a leakage track bias generator 310 that receives vcc and vccq as inputs and generates $vb_{vccq}$ and $vb_{vcc}$ as the bias voltage of a high side comparator 320. Thus, the leakage track bias generator 310, which can track M0's leakage current, can generate $vb_{vccq}$ and which can function as the bias voltages of the high side comparator 320. High side comparator 320 can output a signal to control the on/off state of M1 and M2. An inverter 330 can be provided between the control signal and M2, such that whenever M1 is on, M2 is off, and vice versa. Any circuit that can receive vcc and vccq as inputs and can generate $vb_{vccq}$ and $vb_{vcc}$ based thereon, can be considered an example of a leakage track bias generator.

When vcc is greater than vccq, M1 can be on, M2 can be off, and any current resulting from any difference between Vbulk and vcc can pass through M1 rather than producing leakage in M0, while the path between Vbulk and vccq can be blocked by M2. When vccq is greater than vcc, M1 can be off, M2 can be on, and current resulting from any difference between Vbulk and vccq can pass through M2 rather than producing leakage in M0, while the path between Vbulk and vcc can be blocked by M1. In those two cases, a leakage path between vcc and vccq can be avoided, together with a leakage current between vccq and vcc. In this way, M0 can be protected from leakage current.

High side comparator 320 can be considered an example of a comparator circuit corresponding to high voltage sources. In another option, not illustrated, a low-side comparator could be similarly used.

Figure 4:
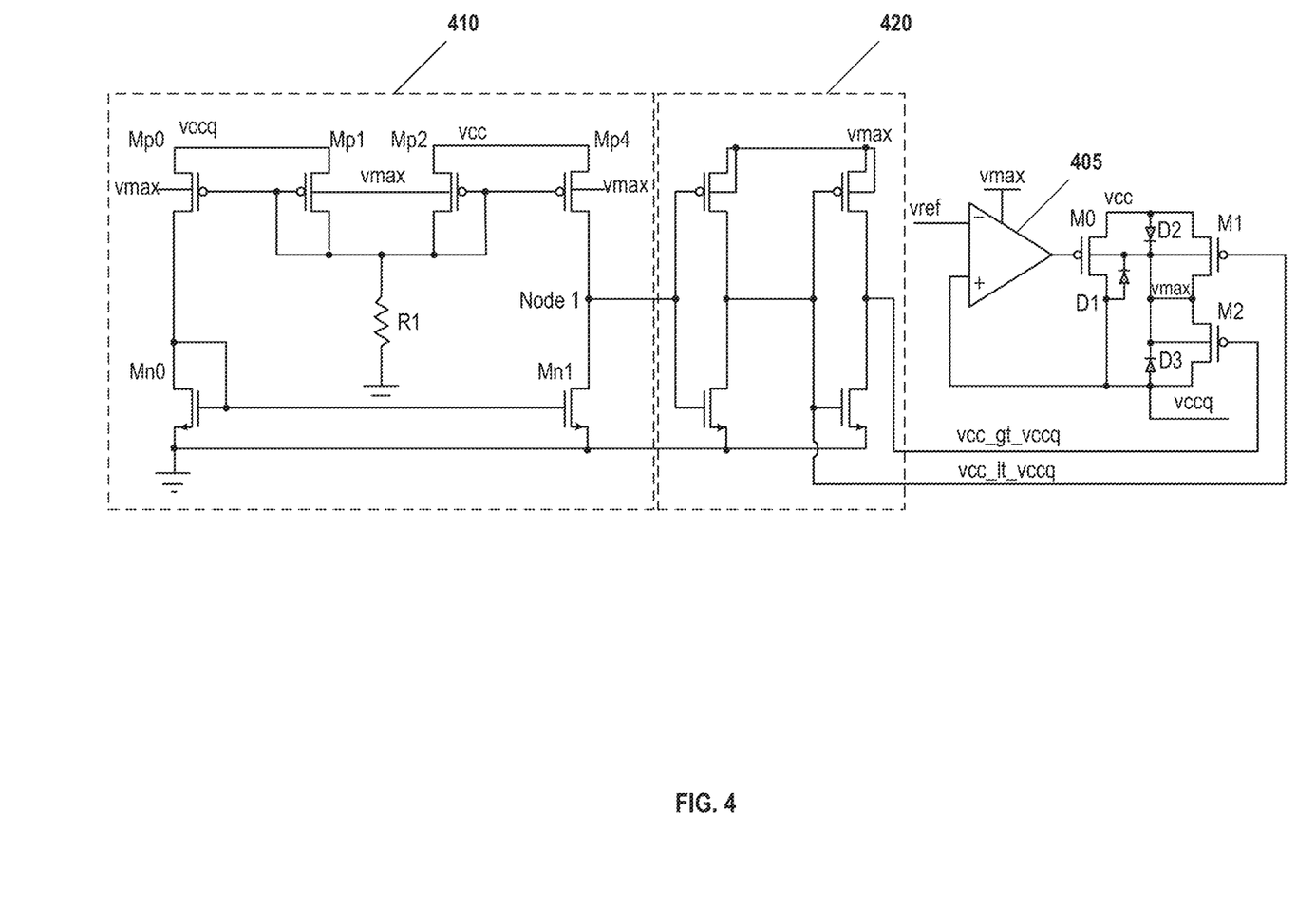
FIG. 4 illustrates a circuit diagram of another exemplary power leakage blocking circuit, according to some aspects of the present disclosure.

FIG. 4 illustrates a circuit diagram of another exemplary power leakage blocking circuit, according to some aspects of the present disclosure. FIG. 4 can be considered a more detailed implementation that is broadly consistent with the approach of FIG. 3. In FIG. 4, as in FIG. 3, transistors M1 and M2 can provide blocking for transistor M0. As in FIG. 1, the greyed-out diodes, D1, D2, and D3, represent the potential leakage paths. Amplifier 405 together with transistor M0 can be viewed as a low-dropout regulator, more broadly as a voltage generation circuit, or still more broadly, as an example of a power generation circuit. While a low-dropout regulator is one example of a power generation circuit as well as an example of a voltage generation circuit, and while FIGS. 1 and 4 provide examples of low-dropout regulators; nevertheless, these are merely illustrative examples and not limitations. Other low-dropout regulators and other categories of voltage generation circuits and/or power generation circuits are also permitted. As with the amplifier 110 in FIG. 1, amplifier 405 in FIG. 4 may be an error amplifier or Op-Amp. Amplifier 405 may be provided with a reference voltage (vref).

In the approach shown in FIG. 4, a resistor R1 can be selected to imitate the potential leakage current through D1 or the combination of D1, D2, and D3, or any sub-combination thereof.

Circuit 410 may be referred to as a comparator-like circuit or a voltage selection circuit. Thus circuit 410 may perform a similar function to leakage track bias generator 310 and high side comparator 320, although there may not be a precise one-to-one mapping between these approaches. Circuit 410, including resistor R1, can be provided with vmax. As in the approach of FIG. 2, the pair of transistors, M1 and M2, can provide a path between the higher of vcc or vccq and vmax. This voltage, vmax, can be equivalent to Vbulk shown in FIG. 3, and can be referred to as vmax for convenience only, and not by way of limitation. The output of circuit 410 can be a voltage level at Node 1, which can be high or low, respectively, indicating that vcc is greater than vccq or that vcc is less than vccq. The voltage at Node 1 can be considered a control voltage.

As shown in FIG. 4, the bulk of Mp0, Mp1, Mp2, and Mp4 can be provided with the same voltage as the supply voltage of amplifier 405, vmax. Gates of Mp0, Mp1, Mp2, and Mp4 can be controlled by the voltage across R1. The gates and drains of Mp1 and Mp2 may be connected to one another. Meanwhile the drain and gate of Mn0 may be connected to one another and to the gate of Mn1. Thus, when a sufficiently high voltage is provided at the gates of Mn0 and Mn1, then Node 1 is pulled toward ground. On the other hand, when a sufficiently low voltage is provided at the gates of Mn0 and Mn1, and Mp4 is on, then Node1 is pulled up toward vcc.

Circuit 420 can take the control voltage at Node 1 and provide a signal along either vcc_gt_vccq, corresponding to the case when vcc is greater than vccq, or vcc_lt_vccq corresponding to the case where vccq is greater than vcc. Circuit 420 can be referred to as a signal pair generation circuit.

Circuit 420 may be likened to the portion of FIG. 3 providing the inverted and un-inverted signals based on the output of high side comparator 320 in FIG. 3. Thus, when vcc is greater than vccq, M1 may be on, and M2 may be off. Likewise, when vcc is less than vccq, M2 may be on, and M1 may be off.

As in the case of FIG. 3, leakage current may be effectively blocked because current may pass through one transistor of the pair M1, M2 such that leakage currently may effectively be blocked.

When vcc is greater than vccq, M1 can be on, M2 can be off, and any current resulting from any difference between vmax and vcc can pass through M1 rather than producing leakage in M0, while the path between vmax and vccq can be blocked by M2. When vccq is greater than vcc, M1 can be off, M2 can be on, and current resulting from any difference between vmax and vccq can pass through M2 rather than producing leakage in M0, while the path between vmax and vcc can be blocked by M1. In those two cases, a leakage path between vcc and vccq can be avoided, together with a leakage current between vccq and vcc. In this way, M0 can be protected from leakage current.

This approach may work with ultra-low vcc and/or vccq, even in a sub-threshold region for a detector. Thus, some implementations may avoid leakage currents that may occur in a detector-based solution.

The comparator-like structure of circuit 410 can provide high accuracy in yielding the indication signals. This may be achieved by applying the same vcc and vccq signals to circuit 410 and by emulating leakage current.

In this case, other PMOS devices can be used to generate indication signals (vcc_gt_vccq and vcc_lt_vccq). The leakage current can be mimicked with a resistor, R1. The selection of R1 can be made based on an expected leakage current, which may depend on the physical characteristics of M0. The indication signal may track process corners and temperature changes.

R1 can be very big to make Mp2 work in low bias current level and sub-threshold region. The size of R1 may, as noted above, be based on the configuration of the transistors including M0 and Mp2.

Additionally, some implementations may simplify the bulk switch structure using indicator signals. For example, instead of using the circuit of FIG. 2, with four transistors M1, M2, M3, and M4, and two detectors, the circuit of FIG. 3 or FIG. 4 may rely on two transistors, M1 and M2, together with the accompanying circuits. Moreover, a single level output from high side comparator 320 in FIG. 3 or the single voltage level at Node 1 in FIG. 4 may replace the four voltage levels (in two pairs) provided in FIG. 2. Thus, the indicator signals and the blocking transistor structure may be simplified relative to other implementations.

Thus, some implementations may have various benefits and/or advantages, including but not limited to reducing leakage current across M0. Other benefits may include a simplified construction and potentially a smaller die size. Furthermore, some implementations may provide greater accuracy in tracking vcc and vccq.

Furthermore, in view of the reduced leakage current, some implementations may have better power efficiency and lower wasted energy from heat. The working lifetime of M0 may also be improved in the absence of a relatively high amperage leakage current. The quality of generating vccq from vcc may also be improved.

Additionally, some implementations may improve the temperature rating of the corresponding device. For example, some implementations may be able to operate at 120 degrees Fahrenheit, rather than be limited to a cooler temperature. Other benefits and advantages may also be present.

In some implementations, the leakage current may be about 300 nano-amps (nA) in a worst-case scenario, and about 30 nA in a typical scenario. This three-orders-of-magnitude reduction in leakage current may be considered as effectively blocking leakage current. It is not necessary for leakage current to be precisely zero amps to be considered blocked.

Figure 5:
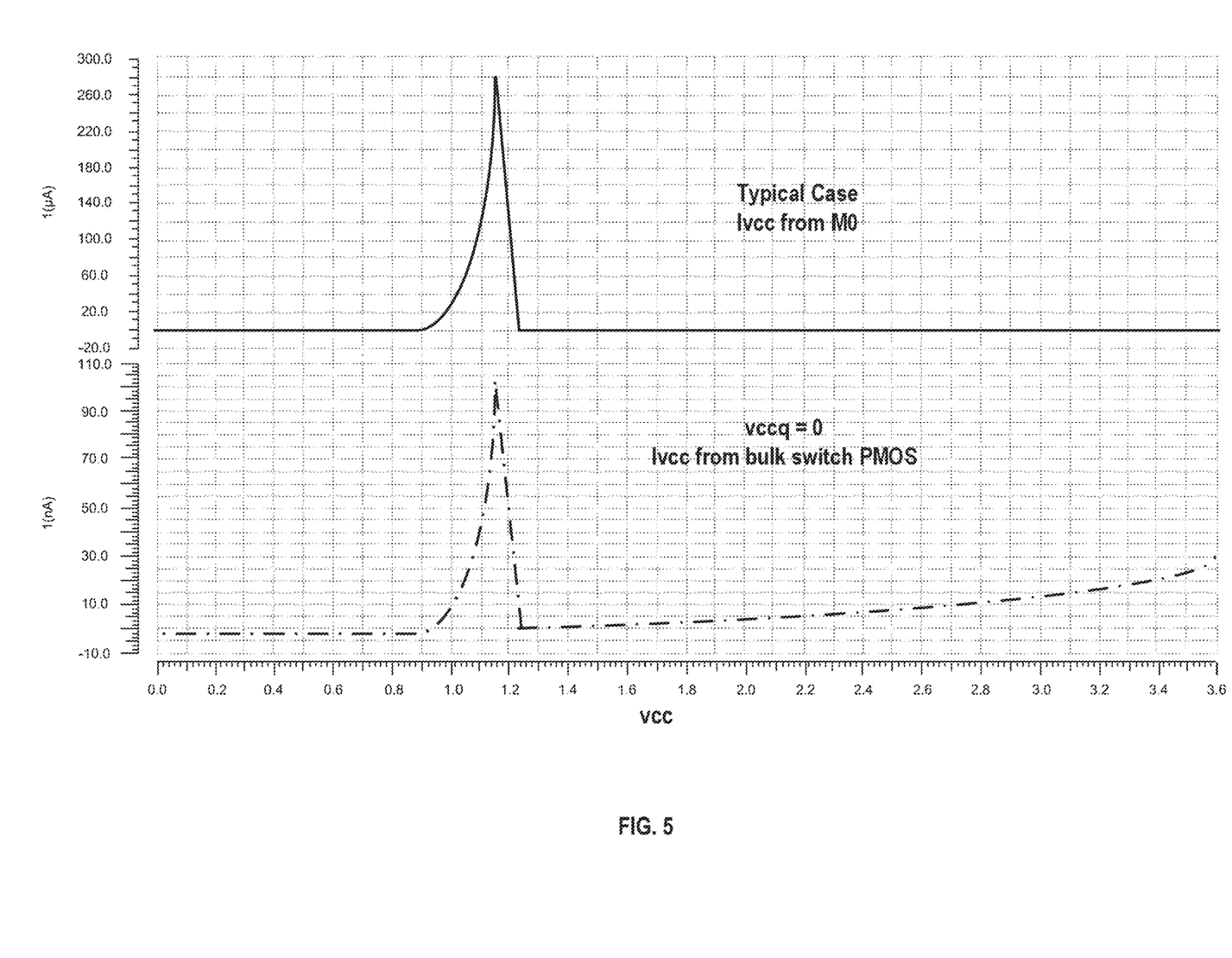
FIG. 5 illustrates a comparative example of simulation results of leakage current.

FIG. 5 illustrates a comparative example of simulation results of leakage current. As shown in FIG. 5, the current across M0 in a typical case for the circuit shown in FIG. 2 can be seen to have a spike up to 300 micro-amps when vcc is around 1.2 V, and vccq is grounded. There may also be a leakage current with a similarly shaped spike from the bulk switch PMOS in the circuit, but this current may be much smaller, such as around 110 nano-amps. The scale is very different between the track of the bulk PMOS and M0.

Figure 6:
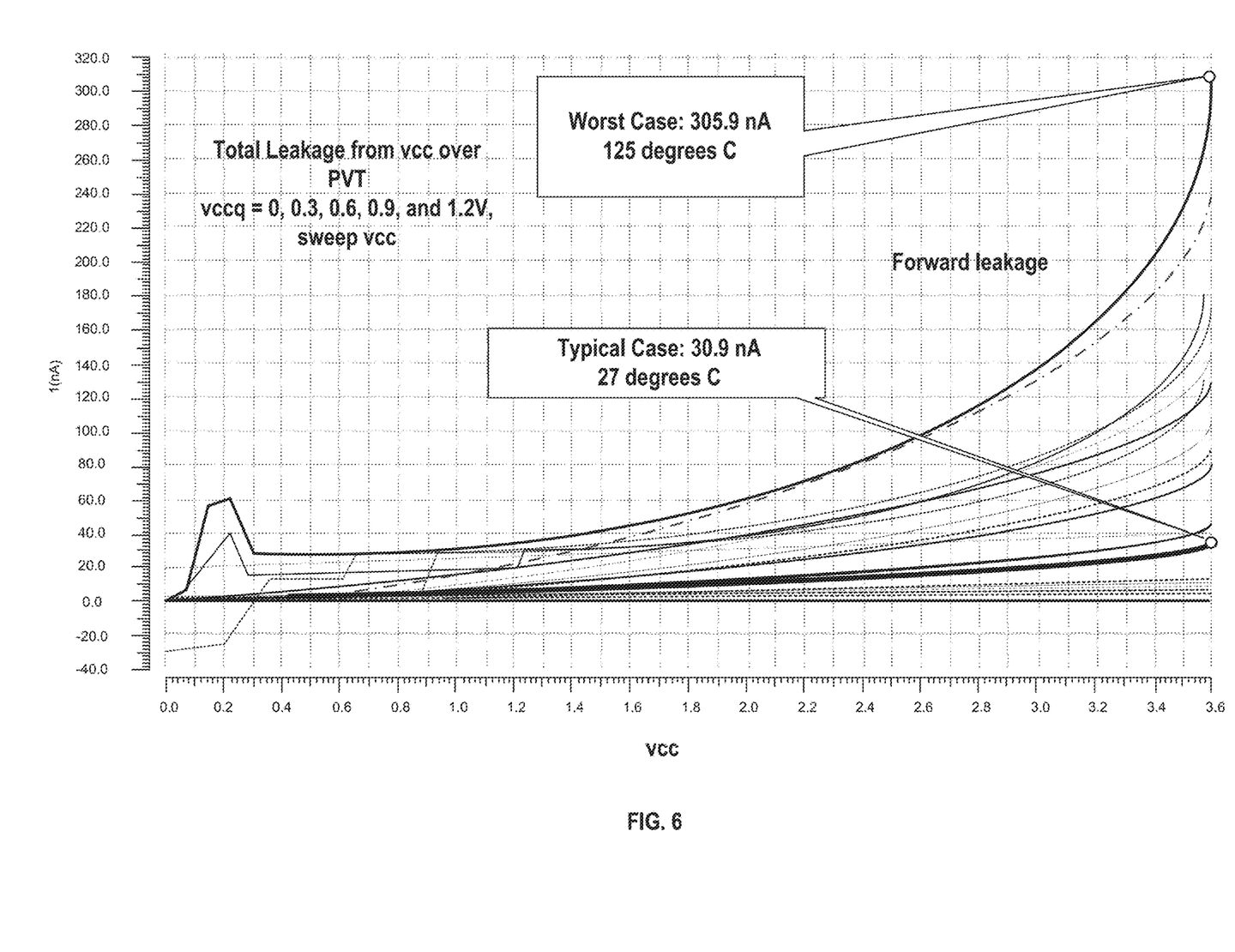
FIG. 6 illustrates an example of simulation results of leakage current, according to some aspects of the present disclosure.

FIG. 6 illustrates an example of simulation results of leakage current according to some implementations. The numerous tracks here show the difference in temperature dependency for the leakage current in some implementations. As shown, in the typical case of 27 degrees Celsius operating temperature, the leakage current is 30.9 nano-amps. In the worst case, where the temperature is 125 degrees Celsius, the leakage current is 305.9 nano-amps. In both cases, these also represent the case where vcc is at its maximum value of 3.6. The chart also shows different tracks at different values of vccq, not only when vccq is grounded.

What is absent from FIG. 6 is any spike in power around 1.2 V. Thus, it can be concluded that according to these simulation results, there is a significant improvement in leakage current from the use of some implementations of the above-described circuits and the following method.

Figure 7:
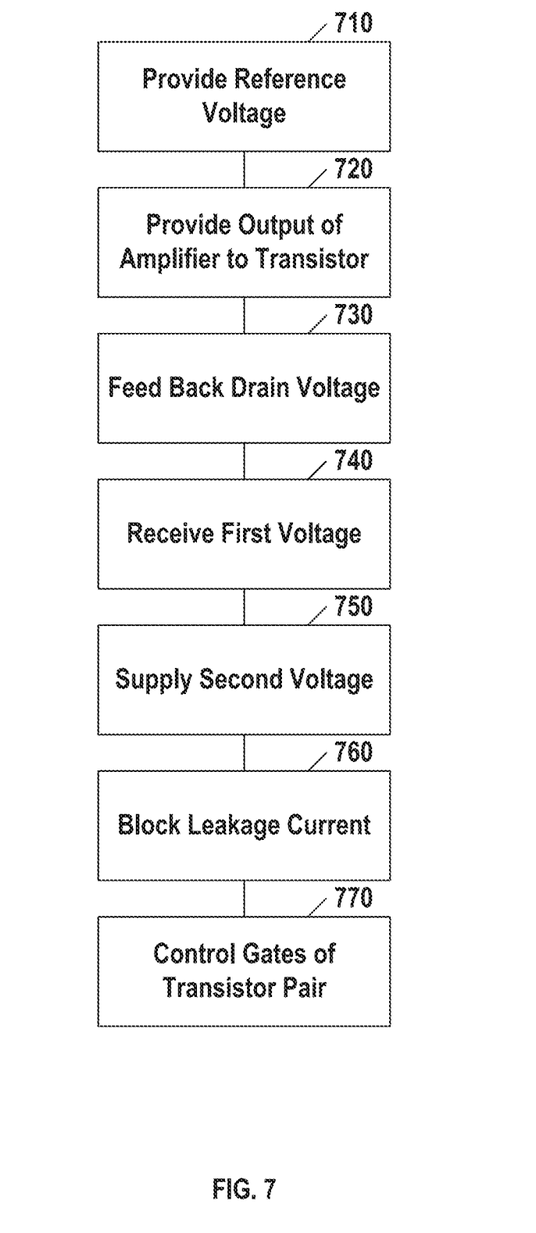
FIG. 7 illustrates a flowchart of an exemplary method for power leakage blocking, according to some aspects of the present disclosure.

FIG. 7 illustrates a flowchart of an exemplary method for power leakage blocking, according to some aspects of the present disclosure. The method of FIG. 7 can include, at 710, providing a reference voltage to a negative input of an amplifier. This may be vref shown in FIG. 4.

The method of FIG. 7 may also include, at 720, providing an output of the amplifier to a gate of a first transistor. This may be the gate of transistor M0 shown in FIGS. 3 and 4.

The method of FIG. 7 may also include, at 730, feeding back a drain voltage of the first transistor to a positive input of the amplifier. This may be the feedback path to the positive terminal of the amplifier shown in FIG. 4.

The method of FIG. 7 may also include, at 740, receiving a first voltage at the source of the first transistor. The first voltage may be vcc shown in FIGS. 3 and 4.

The method of FIG. 7 may also include, at 750, supplying a second voltage at the drain of the first transistor. The second voltage may be vccq shown in FIGS. 3 and 4.

The method of FIG. 7 may also include, at 760, blocking leakage current across the transistor using a pair of transistors. The pair of transistors can include a second transistor (for example, M1 in FIGS. 3 and 4) and a third transistor (for example, M2 in FIGS. 3 and 4). Respective bulks of the pair of transistors can be connected to a bulk of the first transistor (for example, M0 in FIGS. 3 and 4).

The method of FIG. 7 may also include, at 770, controlling the gates of the pair of transistors according to a comparison between the first voltage and the second voltage, such that only one of the pair of transistors is on at a time.

This may be accomplished using the signal and inverted signal from high side comparator 320 in FIG. 3. This may also be accomplished by the use of signals vcc_gt_vccq and vcc_lt_vccq, as shown in FIG. 4. Other techniques are also permitted, with these two examples serving as illustrations and not limitations.

Although the features of FIG. 7 are shown as a series of operations, the operations of FIG. 7 may be performed in a different order, and various of the operations may be performed in parallel to one another. The method of FIG. 7 may be performed using a circuit such as shown in FIG. 3 or 4, and may be implemented in a memory system. More broadly, the method of FIG. 7 and the circuits of FIGS. 3 and 4 may be implemented in any system providing low-dropout regulation or similar voltage boosting.

Figure 8:
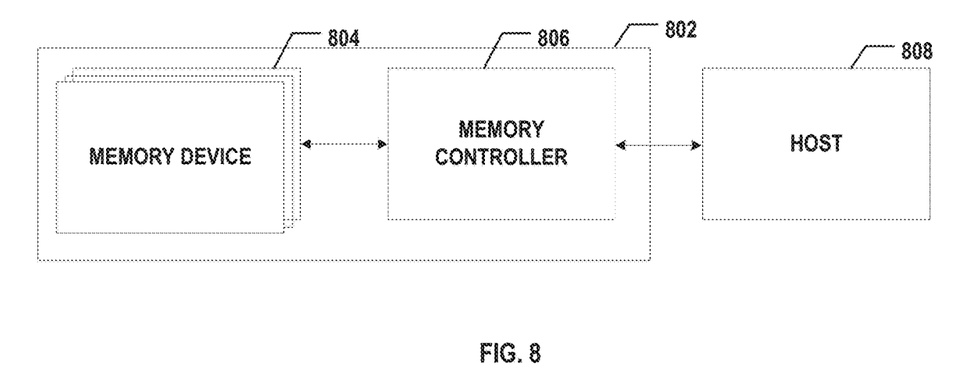
FIG. 8 illustrates a block diagram of an exemplary system having a memory device, according to some aspects of the present disclosure.

FIG. 8 illustrates a block diagram of an exemplary system 800 having a memory device, according to some aspects of the present disclosure. System 800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein.

As shown in FIG. 8, system 800 can include a host 808 and a memory system 802 having one or more memory devices 804 and a memory controller 806. Host 808 can be a processor of an electronic device, such as a central processing unit (CPU), or a system-on-chip (SoC), such as an application processor (AP). Host 808 can be configured to send or receive the data to or from memory devices 804.

Memory device 804 can be any memory devices, such as a NAND Flash memory device. In some implementations, each memory device 804 includes peripheral circuits having one or more circuits for power leakage blocking as disclosed herein.

Memory controller 806 is coupled to memory device 804 and host 808 and is configured to control memory device 804, according to some implementations. Memory controller 806 can manage the data stored in memory device 804 and communicate with host 808. In some implementations, memory controller 806 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 806 is designed for operating in a high duty-cycle environment SSDs or embedded multi-media-cards (eMMCs) used as data storage for mobile devices, such as smartphones, tablets, laptop computers, etc., and enterprise storage arrays. Memory controller 806 can be configured to control operations of memory device 804, such as read, erase, and program operations. Memory controller 806 can also be configured to manage various functions with respect to the data stored or to be stored in memory device 804 including, but not limited to bad-block management, garbage collection, logical-to-physical address conversion, wear leveling, etc. In some implementations, memory controller 806 is further configured to process error correction codes (ECCs) with respect to the data read from or written to memory device 804. Any other suitable functions may be performed by memory controller 806 as well, for example, formatting memory device 804. Memory controller 806 can communicate with an external device (e.g., host 808) according to a particular communication protocol. For example, memory controller 806 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 9A:
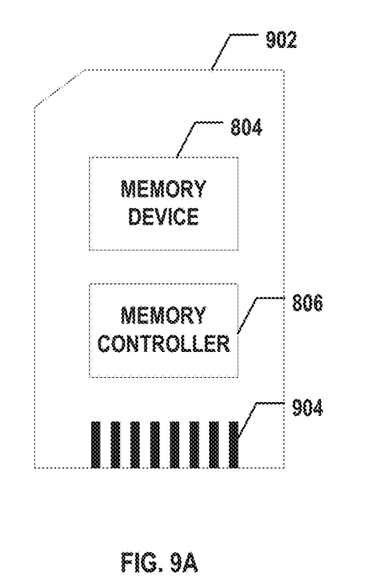
FIG. 9A illustrates a diagram of an exemplary memory card having a memory device, according to some aspects of the present disclosure.
Figure 9B:
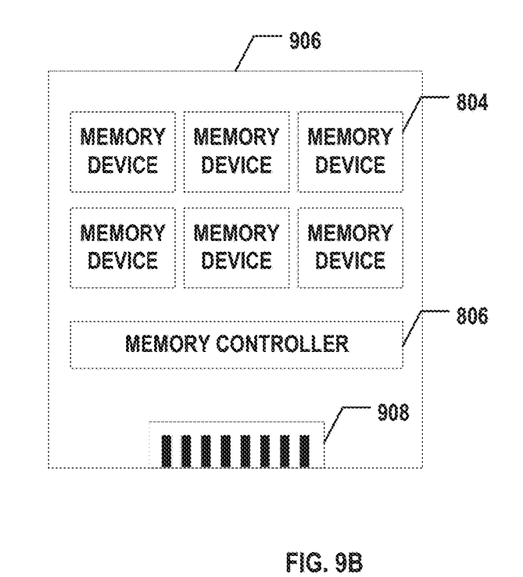
FIG. 9B illustrates a diagram of an exemplary solid-state drive (SSD) having a memory device, according to some aspects of the present disclosure.

Memory controller 806 and one or more memory devices 804 can be integrated into various types of storage devices, for example, be included in the same package, such as a universal Flash storage (UFS) package or an eMMC package. That is, memory system 802 can be implemented and packaged into different types of end electronic products. In one example as shown in FIG. 9A, memory controller 806 and a single memory device 804 may be integrated into a memory card 902. Memory card 902 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 902 can further include a memory card connector 904 coupling memory card 902 with a host (e.g., host 808 in FIG. 8). In another example as shown in FIG. 9B, memory controller 806 and multiple memory devices 804 may be integrated into an SSD 906. SSD 906 can further include an SSD connector 908 coupling SSD 906 with a host (e.g., host 808 in FIG. 8). In some implementations, the storage capacity and/or the operation speed of SSD 906 is greater than those of memory card 902.

Figure 10:
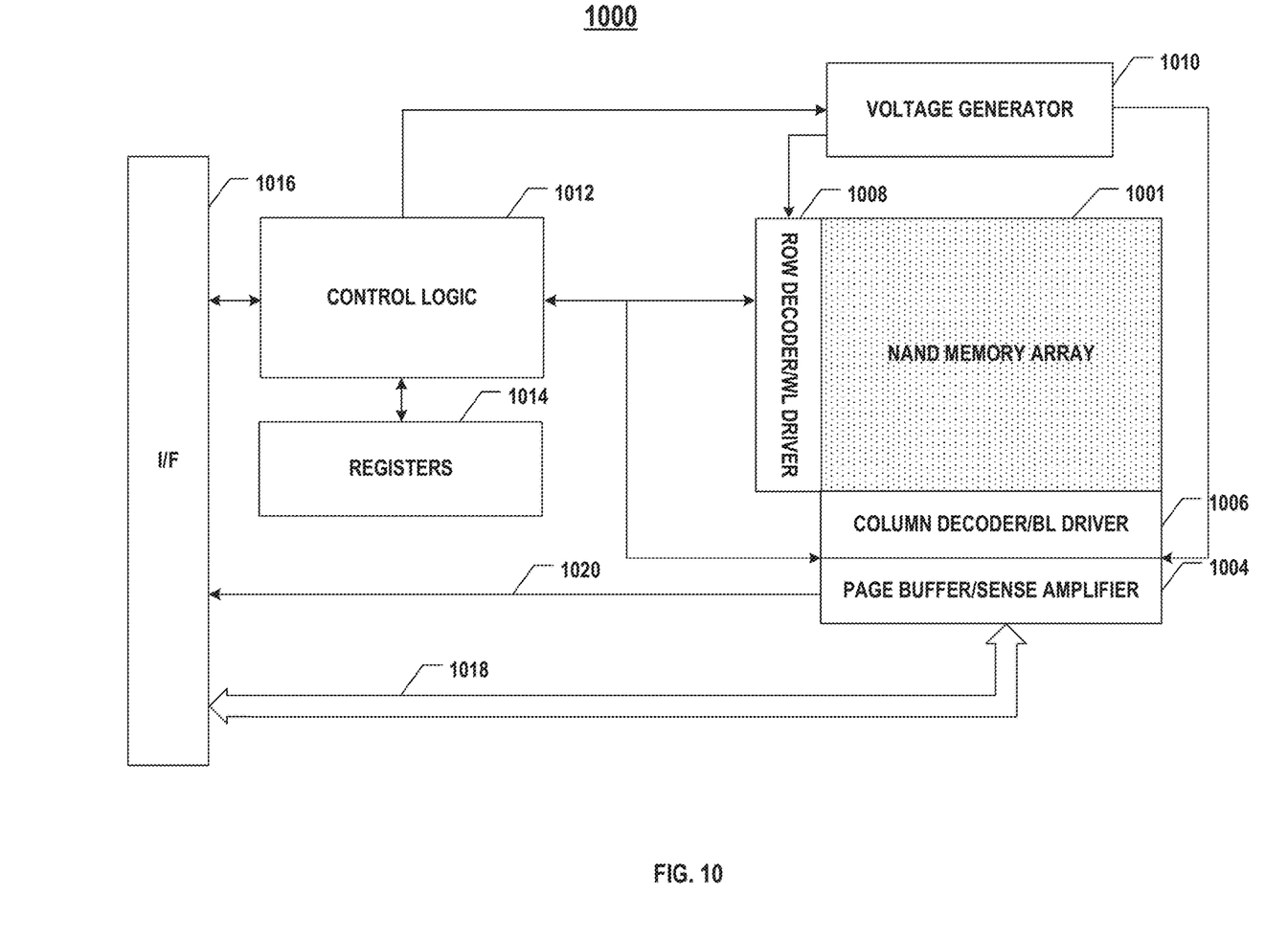
FIG. 10 illustrates an exemplary NAND Flash memory device, according to some aspects of the present disclosure.

FIG. 10 illustrates an exemplary NAND Flash memory device 1000, according to some aspects of the present disclosure. The NAND Flash memory 1000 may be or include a three-dimensional (3D) NAND memory device. As shown in FIG. 10, NAND Flash memory 1000 can include a NAND memory array 1001 including an array of NAND memory cells in the form of NAND memory strings. NAND Flash memory 1000 can also include peripheral circuits configured to facilitate the operations of NAND memory cells, such as read, program, and erase. The peripheral circuits can include, for example, a page buffer 1004, a column decoder/bit line driver 1006, a row decoder/word line driver 1008, a voltage generator 1010, control logic 1012, registers 1014, an interface 1016, and a data bus 1018. It is understood that in some examples, additional peripheral circuits may be included as well. A circuit for power leakage blocking can be implemented in various places including voltage generator 1010.

Page buffer 1004 can be configured to read and program data from and to NAND memory array 1001 according to the control of control logic 1012. In one example, page buffer 1004 may store one page of program data (write data) to be programmed into one page of NAND memory array 1001. In another example, page buffer 1004 also performs program verify operations to ensure that the data has been properly programmed into memory cells coupled to selected word lines. Row decoder/word line driver 1008 can be configured to be controlled by control logic 1012 and select a block of NAND memory array 1001 and a word line of the selected block. Row decoder/word line driver 1008 can be further configured to drive the selected word line using a word line voltage generated from voltage generator 1010. Voltage generator 1010 can be configured to be controlled by control logic 1012 and generate the word line voltages (e.g., read voltage, program voltage, pass voltage, local voltage, and verification voltage) to be supplied to NAND memory array 1001. Column decoder/bit line driver 1006 can be configured to be controlled by control logic 1012 and select one or more NAND memory strings by applying bit line voltages generated from voltage generator 1010. For example, column decoder/bit line driver 1006 may apply column signals for selecting a set of N bits of data from page buffer 1004 to be outputted in a read operation.

Control logic 1012 can be coupled to each peripheral circuit and configured to control operations of peripheral circuits. Registers 1014 can be coupled to control logic 1012 and include status registers, command registers, and address registers for storing status information, command operation codes (OP codes), and command addresses for controlling the operations of each peripheral circuit.

Interface 1016 can be coupled to control logic 1012 and act as a control buffer to buffer and relay control commands received from a host (not shown) to control logic 1012 and status information received from control logic 1012 to the host. Interface 1016 can also be coupled to page buffer 1004 via column decoder/bit line driver 1006 and act as an IO interface and a data buffer to buffer and relay the program data received from a host (not shown) to page buffer 1004 and the read data from page buffer 1004 to the host. As shown in FIG. 10, bidirectional data bus 1018 can connect interface 1016 and column decoder/bit line driver 1006 for transferring data to and from NAND memory array 1001. The circuit for power leakage blocking disclosed herein (e.g., in FIGS. 3 and 4) may provide voltage generation for voltage generator 1010. The circuit for power leakage blocking may also be used to generate voltages in other portions of a memory device or in other devices that are not memory devices, with these use cases being provided by way of example and illustration and not by way of limitation.

According to one aspect of the present disclosure, a circuit for power leakage blocking can include a voltage generation circuit that includes an amplifier connected at a negative input to a reference voltage and providing an output to a gate of a first transistor. A drain voltage of the first transistor can be fed back to a positive input of the amplifier. The voltage generation circuit can receive a first voltage at the source of the first transistor. The voltage generation circuit can supply a second voltage at the drain of the first transistor. The circuit can further include a pair of transistors. The pair of transistors can include a second transistor and a third transistor. Respective bulks of the pair of transistors can be connected to a bulk of the first transistor. The gates of the pair of transistors can be controlled according to a comparison between the first voltage and the second voltage, such that only one of the pair of transistors is on at a time.

In some implementations, the circuit can further include a comparator circuit configured to compare a first bias voltage due to the first voltage and a second bias voltage due to the second voltage and to output the first voltage when the first voltage is higher and to output the second voltage when the second voltage is higher. The gates of the pair of transistors can be controlled by the output of the comparator circuit.

In some implementations, the circuit can further include a leakage track bias generator circuit configured to track the leakage current of the first transistor and generate the first bias voltage and the second bias voltage based on the first voltage and the second voltage.

In some implementations, the comparator circuit can be configured to generate a single output signal. The circuit can further include an inverter between the comparator circuit and a gate of one of the pair of transistors. An inverted side of the inverter can be connected to the gate of the one of the pair of transistors, and a source side of the inverter can be connected to a gate of the other of the pair of transistors.

In some implementations, the circuit can further include a voltage selection circuit configured to present a control voltage based on the first voltage and the second voltage. Control of the gates of the pair of transistors can be based on the control voltage.

In some implementations, the voltage selection circuit can include four p-channel metal-oxide-semiconductor (PMOS) transistors and two n-channel metal-oxide-semiconductor (NMOS) transistors.

In some implementations, respective sources of the two NMOS transistors can be connected to the ground, and respective gates of the two NMOS transistors can be connected to each other.

In some implementations, drains of the two NMOS transistors can be connected to respective drains of two of the four PMOS transistors. The two PMOS transistors can include a first PMOS transistor and a second PMOS transistor. A source of the first PMOS transistor can be supplied with the first voltage, and a source of the second PMOS transistor can be supplied with the second voltage.

In some implementations, the four PMOS transistors can further include a third PMOS transistor and a fourth PMOS transistor. The third PMOS transistor can have a gate and a drain coupled to a gate of the first PMOS transistor. The fourth PMOS transistor can have a gate and a drain coupled to a gate of the second PMOS transistor. The third PMOS transistor can have a source supplied with the first voltage. The fourth PMOS transistor can have a source supplied with the second voltage.

In some implementations, the circuit further includes a resistor configured to mimic leakage current in the first transistor. The resistor can be coupled between the ground and the drains of the third PMOS transistor and the fourth PMOS transistor.

In some implementations, a node between the drain of the second PMOS transistor and the source of the second PMOS transistor can include an output of the voltage selection circuit. The control of the gates of the pair of transistors can be based on the control voltage at the node.

In some implementations, a signal pair generation circuit can be configured to receive the control voltage from the voltage selection circuit and to generate a pair of signal voltages connected respectively to gates of the second transistor and the third transistor.

In some implementations, when the first voltage is greater than the second voltage, the pair of signal voltages can be configured to turn the second transistor on and the third transistor off, and when the first voltage is lower than the second voltage, the pair of signal voltages can be configured to turn the second transistor off and the third transistor on.

In some implementations, the signal pair generation circuit can include four transistors comprising a fifth PMOS transistor, a sixth PMOS transistor, a third NMOS transistor, and a fourth NMOS transistor.

In some implementations, sources of the fifth PMOS transistor and the sixth PMOS transistor can be connected to one another, and sources of the third NMOS transistor and the fourth NMOS transistor can be connected to the ground.

In some implementations, a drain of the fifth PMOS transistor can be connected to a drain of the third NMOS transistor, and a drain of the sixth PMOS transistor can be connected to a drain of the fourth NMOS transistor.

In some implementations, a first output of the signal pair generation circuit can be taken from a node between the drain of the sixth PMOS transistor and the drain of the fourth NMOS transistor. The first output can be connected to the gate of the third transistor.

In some implementations, a second output of the signal pair generation circuit can be taken from the gate of the fourth NMOS transistor. The second output can be connected to the gate of the second transistor.

According to another aspect of the present disclosure, a circuit can include a low-dropout regulator having a first transistor. The low-dropout regulator is configured to generate a second voltage based on a first voltage. The circuit can also include a pair of transistors, namely a second transistor and a third transistor, with respective bulks of the pair of transistors connected to a bulk of the first transistor. The gates of the pair of transistors can be controlled according to a comparison between the first voltage and the second voltage, such that only one of the pair of transistors is on at a time.

In some implementations, the circuit can further include a comparator circuit configured to compare a first bias voltage due to the first voltage and a second bias voltage due to the second voltage and output the first voltage when the first voltage is higher and the second voltage when the second voltage is higher. The gates of the pair of transistors can be controlled by the output of the comparator circuit.

In some implementations, the circuit can also include a voltage selection circuit, configured to present a control voltage based on the first voltage and the second voltage. Control of the gates of the pair of transistors can be based on the control voltage.

In some implementations, the circuit can further include a signal pair generation circuit configured to receive the control voltage from the voltage selection circuit and generate a pair of signal voltages connected respectively to gates of the second transistor and the third transistor.

According to a further aspect of the present disclosure, a method for power leakage blocking can include providing a reference voltage to a negative input of an amplifier. The method can also include providing an output of the amplifier to a gate of a first transistor. The method can further include feeding back a drain voltage of the first transistor a positive input of the amplifier. The method can additionally include receiving a first voltage at the source of the first transistor. The method can also include supplying a second voltage at the drain of the first transistor. The method can further include blocking leakage current across the transistor using a pair of transistors that include a second transistor and a third transistor, with respective bulks of the pair of transistors connected to a bulk of the first transistor. The method can additionally include controlling the gates of the pair of transistors according to a comparison between the first voltage and the second voltage, such that only one of the pair of transistors is on at a time.

According to an additional aspect of the present disclosure, a memory device can include a NAND memory array for storing data. The memory device can also include a peripheral circuit coupled to the NAND memory array and including a voltage generation circuit. The voltage generation circuit can include a low-dropout regulator having a first transistor. The low-dropout regulator can be configured to generate a second voltage based on a first voltage. The low-dropout regulator can also include a pair of transistors, including a second transistor and a third transistor, with respective bulks of the pair of transistors connected to a bulk of the first transistor. Gates of the pair of transistors can be controlled according to a comparison between the first voltage and the second voltage, such that only one of the pair of transistors is on at a time.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A circuit, comprising:
   an amplifier;
   a first transistor, wherein a gate terminal of the first transistor is connected to an output of the amplifier, and a first terminal of the first transistor is connected to an input of the amplifier;
   a second transistor, wherein a first terminal of the second transistor is connected to a second terminal of the first transistor;
   a third transistor, wherein a first terminal of the third transistor is connected to the first terminal of the first transistor, and a second terminal of the third transistor is connected to a second terminal of the second transistor;
   a signal pair generation circuit connected to a gate terminal of the second transistor and a gate terminal of the third transistor; and
   a leakage track bias generator circuit connected to the signal pair generation circuit, wherein the leakage track bias generator circuit comprises a resistor, and a first terminal of the resistor is connected to a reference voltage.

2. The circuit of claim 1, wherein the leakage track bias generator circuit comprises a first input and a second input, and the leakage track bias generator circuit is configured to output a control voltage to the signal pair generation circuit based on a voltage of the first input and a voltage of the second input.

3. The circuit of claim 2, wherein the signal pair generation circuit is configured to output a first signal to the gate terminal of the second transistor and a second signal to the gate terminal of the third transistor based on the control voltage.

4. The circuit of claim 1, wherein a bulk of the first transistor, a bulk of the second transistor, and a bulk of the third transistor are connected together.

5. The circuit of claim 1, wherein
   the leakage track bias generator circuit further comprises four p-channel metal-oxide-semiconductor (PMOS) transistors and two n-channel metal-oxide-semiconductor (NMOS) transistors;
   respective sources of the two NMOS transistors are connected to the reference voltage; and
   respective gates of the two NMOS transistors are connected to each other.

6. The circuit of claim 5, wherein bulks of the four PMOS transistors are connected together.

7. The circuit of claim 5, wherein gate terminals of the four PMOS transistors are connected together.

8. The circuit of claim 5, wherein
   the two NMOS transistors are connected to respective terminals of two of the four PMOS transistors comprising a first PMOS transistor and a second PMOS transistor; and
   a first terminal of the first PMOS transistor is connected to a first input, and a first terminal of the second PMOS transistor is connected to a second input.

9. The circuit of claim 8, wherein
   the four PMOS transistors further comprise a third PMOS transistor and a fourth PMOS transistor; and
   first terminals of the third PMOS transistor and the first PMOS transistor are connected together, and first terminals of the fourth PMOS transistor and the second PMOS transistor are connected together.

10. The circuit of claim 1, wherein a resistance of the resistor is related to physical characteristics of the first transistor.

11. The circuit of claim 9, wherein a second terminal of the resistor is connected to a second terminal of the third PMOS transistor and a second terminal of the fourth PMOS transistor.

12. The circuit of claim 3, wherein
   when a first voltage of the first input is greater than a second voltage of the second input, the first signal and the second signal are configured to turn the second transistor on and the third transistor off, and
   when the first voltage is lower than the second voltage, the first signal and the second signal are configured to turn the second transistor off and the third transistor on.

13. The circuit of claim 1, wherein
   the signal pair generation circuit comprises four transistors comprising a fifth PMOS transistor, a sixth PMOS transistor, a third NMOS transistor, and a fourth NMOS transistor;
   sources of the fifth PMOS transistor and the sixth PMOS transistor are connected to one another, and sources of the third NMOS transistor and the fourth NMOS transistor are connected to the reference voltage; and
   a drain of the fifth PMOS transistor is connected to a drain of the third NMOS transistor, and a drain of the sixth PMOS transistor is connected to a drain of the fourth NMOS transistor.

14. The circuit of claim 13, wherein
   a first output of the signal pair generation circuit is taken from a node between the drain of the sixth PMOS transistor and the drain of the fourth NMOS transistor, and the first output is connected to the gate terminal of the third transistor; and
   a second output of the signal pair generation circuit is taken from a gate of the fourth NMOS transistor, and the second output is connected to the gate terminal of the second transistor.

15. A circuit, comprising:
   a low-dropout regulator comprising a first transistor, wherein the low-dropout regulator is configured to output a second voltage based on a first voltage;
   a pair of transistors comprising a second transistor and a third transistor, wherein respective bulks of the pair of transistors are connected to a bulk of the first transistor; and
   a control circuit connected to gates of the pair of transistors, wherein the control circuit is configured to output signals to the gates of the pair of transistors, the control circuit comprises a resistor, and a first terminal of the resistor is connected to a reference voltage.

16. The circuit of claim 15, wherein
   the control circuit comprises a signal pair generation circuit configured to output signals to the gates of the pair of transistors based on a control voltage; and
   the control voltage is related to the first voltage and the second voltage.

17. The circuit of claim 16, wherein
the control circuit further comprises a leakage track bias generator circuit connected to the signal pair generation circuit; and
the leakage track bias generator circuit is configured to output the control voltage to the signal pair generation circuit based on the first voltage and the second voltage.

18. The circuit of claim 15, wherein
when the first voltage is greater than the second voltage, the signals are configured to turn the second transistor on and the third transistor off; and
when the first voltage is lower than the second voltage, the signals are configured to turn the second transistor off and the third transistor on.

19. The circuit of claim 15, wherein the second transistor and the third transistor are connected in series.

20. A memory device, comprising:
a memory array for storing data; and
a peripheral circuit coupled to the memory array and comprising a voltage generation circuit, the voltage generation circuit comprising:
an amplifier;
a first transistor; wherein a gate terminal of the first transistor is connected to an output of the amplifier, and a first terminal of the first transistor is connected to an input of the amplifier;
a second transistor, wherein a first terminal of the second transistor connected to a second terminal of the first transistor;
a third transistor, wherein a first terminal of the third transistor is connected to the first terminal of the second transistor, and a second terminal of the third transistor is connected to a second terminal of the first transistor;
a signal pair generation circuit connected to a gate terminal of the second transistor and a gate terminal of the third transistor; and
a leakage track bias generator circuit connected to the signal pair generation circuit, wherein the leakage track bias generator circuit comprises a resistor, and a first terminal of the resistor is connected to a reference voltage.

* * * * *